United States Patent [19]
Nakagawa

[11] Patent Number: 5,321,278
[45] Date of Patent: Jun. 14, 1994

[54] HIGH ELECTRON MOBILITY TRANSISTOR

[75] Inventor: Yoshikazu Nakagawa, Kyoto, Japan

[73] Assignee: Rohm Co., Ltd., Kyoto, Japan

[21] Appl. No.: 894,780

[22] Filed: Jun. 5, 1992

[30] Foreign Application Priority Data

Oct. 3, 1991 [JP] Japan .................. 3-256353

[51] Int. Cl.$^5$ .................. H01L 29/06; H01L 31/072; H01L 31/109
[52] U.S. Cl. .................. 257/192; 257/194; 257/29
[58] Field of Search .................. 257/192, 195, 200, 18, 257/20, 24

[56] References Cited

U.S. PATENT DOCUMENTS

| 4,827,320 | 5/1989 | Morkoc et al. | 257/192 |
| 5,116,774 | 5/1992 | Huang et al. | 437/40 |

FOREIGN PATENT DOCUMENTS 0381396 1/1990 European Pat. Off. .

1-143270 of 0000 Japan .

OTHER PUBLICATIONS

J. W. Matthews and A. E. Blakeslee, "Defects in Epitaxial Multilayers, I. Misfit Dislocations", *Journal of Crystal Growth*, vol. 27, 1974, pp. 118-125.

*Primary Examiner*—Rolf Hille
*Assistant Examiner*—Wael Fahmy
*Attorney, Agent, or Firm*—Brumbaugh, Graves, Donohue & Raymond

[57] ABSTRACT

A field-effect transistor (FET) in which an InGaAs layer formed on a GaAs substrate is formed in such a manner that the In composition ratio on the gate electrode side on the substrate surface is made small and the In composition ratio on the GaAs substrate side is made large. Thereby, the FET does not cause a decline in the mutual conductance in the FET and a decline in the noise figure (NF) even if negative voltage is applied to a gate electrode.

4 Claims, 3 Drawing Sheets

HIGH ELECTRON MOBILITY TRANSISTOR

BACKGROUND OF THE INVENTION

The present invention relates to a field-effect transistor (hereafter referred to as the FET) using a compound semiconductor. More particularly, the present invention concerns a so-called high electron mobility transistor of a pseudomorphic type in which an indium-gallium-arsenide (hereafter referred to as InGaAs) semiconductor crystal layer containing indium (hereafter referred to as In) and an aluminum-gallium-arsenide (hereafter referred to as AlGaAs) layer are formed on a gallium-arsenide (hereafter referred to as GaAs) semiconductor substrate, thereby constituting an FET.

In recent years, the use of semiconductors in high-frequency regions has become active, FETs operating at high speed at high frequencies have been required, and high electron mobility transistors using compound semiconductors have been developed. To effect higher speed, the so-called pseudomorphic-type FETs in which InGaAs whose electron mobility is greater than that of GaAs is used in a channel layer have been developed.

The basic structure of this pseudomorphic-type FET is such that $In_{0.15}Ga_{0.85}As$ layer whose In composition ratio is, for example, 15% is formed on a GaAs substrate, AlGaAs is formed thereon, and a drain electrode, a source electrode, and a gate electrode are formed on that surface.

In the FET of this structure, the channel layer through which electrons travel is formed in the InGaAs layer, its thickness is small in the vicinity of about 150 Å, and the substrate side thereof abuts against GaAs having small electron affinity, so that electrons are sealed in a quantum well in InGaAs. As a result, this type of FET has an outstanding characteristic that, as compared with a conventional GaAs-type FET, $g_m$ is larger, and the short channel effect is smaller.

Energy band diagrams in cases where 0 V and negative voltage are applied to the gate electrode are respectively shown in FIGS. 5 and 6. In these drawings, the abscissa represents the depth from the gate electrode side in the lower direction of the GaAs substrate, point A indicates an interface between the gate electrode and the AlGaAs layer, point B indicates an interface between the AlGaAs layer and the InGaAs layer, and point C indicates an interface between the InGaAs layer and the GaAs substrate, while the ordinate represents energy. In addition, E shows a distribution of electrons in the direction of the depth of the semiconductor substrate when the FET is operated. It can be appreciated from FIGS. 5 and 6 that the distribution of electrons upon application of the negative voltage to the gate electrode becomes wider in the direction of the depth of the substrate, and a distance a from the surface (point A) of the substrate to the center (point D) of the distribution of electrons is large.

Since the InGaAs layer containing In is formed in the channel layer as described above, the ability is improved. However, there still exists the problem that when the negative voltage is applied to the gate electrode, the mutual conductance $g_m$ of the transistor becomes small. Also, there is a problem in that the noise figure becomes aggravated in a region where the drain current is small.

That is, $g_m$ is expressed by the following Formula (1):

$$g_m = \frac{\mu \cdot Wg \cdot \epsilon}{Lg \cdot a}(Vg - Vth) \quad (1)$$

where $\mu$ is the mobility of electrons, Lg is a gate length, Wg is a gate width, e is a dielectric constant of AlGaAs, Vg is a gate voltage, Vth is a threshold voltage, and a is a distance (see FIG. 5 or 6) between the gate electrode and the channel. If the negative voltage is applied to the gate electrode, the distribution of electrons becomes farther from the substrate surface, and a becomes large. As a result, $g_m$ becomes small from Formula (1).

In addition, the noise figure NF is expressed by the following Formula (2):

$$NF = 1 + 2\pi K_f \cdot f \cdot C_{gs} \sqrt{\frac{Rs + Rg}{g_m}} \quad (2)$$

where $K_f$ is a fitting factor which is determined by the material, configuration, and the like of the semiconductor, f is a frequency during operation, Cgs is a gate capacitance, $g_m$ is mutual conductance, Rs is source resistance, and Rg is gate resistance. It can be appreciated from this Formula (2) that if $g_m$ becomes small, NF becomes large, and the noise figure becomes large.

SUMMARY OF THE INVENTION

In view of the above-described circumstances, it is an object of the present invention to provide an FET whose noise figure does not become deteriorated by preventing $g_m$ from becoming small even when negative voltage is applied to the gate voltage.

The FET in accordance with the present invention is a field-effect transistor comprising: a first semiconductor crystal layer of an indium-gallium-arsenide (InGaAs) containing indium (In), formed on a gallium-arsenide semiconductor substrate (GaAs); a second semiconductor crystal layer of an aluminum-gallium-arsenide (AlGaAs), formed on the first semiconductor crystal layer; and a source electrode, a gate electrode, and a drain electrode which are formed on a surface of the second semiconductor crystal layer, wherein the first semiconductor crystal layer is formed such that an indium composition ratio of the first semiconductor crystal layer becomes smaller from the semiconductor substrate side toward the second semiconductor crystal layer side. As a result, an increase in the distance a between the gate electrode and the channel is canceled by increasing the electron mobility $\mu$.

As described above, it is known that the InGaAs in which In is contained in GaAs has a large electron mobility $\mu$, and that the greater the composition ratio of In up to the In composition ratio of 50% or thereabouts, the greater the mobility $\mu$ becomes.

Meanwhile, the lattice constants of InGaAs and GaAs differ from each other. However, according to Matthews et al., it is shown that in a case where the difference in lattice constant is small and the thickness of the crystal layer is small, their respective crystalline lattices shrink and the lattices are in a distorted state, but growth is possible (Defects in Epitaxial Multilayers 1 Misfit Dislocation, Journal of Crystal Growth, Vol. 27, 1974, p. 118). That is, if the film thickness is within a critical film thickness, InGaAs can be grown on the GaAs substrate, and the thickness of the film which grows becomes small if the In composition ratio becomes large.

In the present invention, therefore, the amount of In in the InGaAs layer is varied, and the In composition ratio is made small on the side close to the gate electrode, and the In composition ratio is made large on the GaAs substrate side. As a result, when negative voltage is applied to the gate electrode, and the center of gravity in the distribution of electrons moves to the interior of the substrate increasing the distance a between the gate electrode and the distribution of electrons, then the In composition ratio becomes large and the electron mobility $\mu$ becomes large. Hence, an increased portion of a in the denominator can be canceled by an increase in the numerator $\mu$, thereby making it possible to control a decline in $g_m$.

In addition, since the In composition ratio of the GaAs buffer layer-side InGaAs is large, a band offset, i.e., an energy gap between the InGaAs region and the GaAs buffer layer, becomes large, so that more electrons can be contained, and the short channel effect can be prevented.

DETAILED DESCRIPTION OF THE PREFERRED EMBODIMENTS

Figure 1:
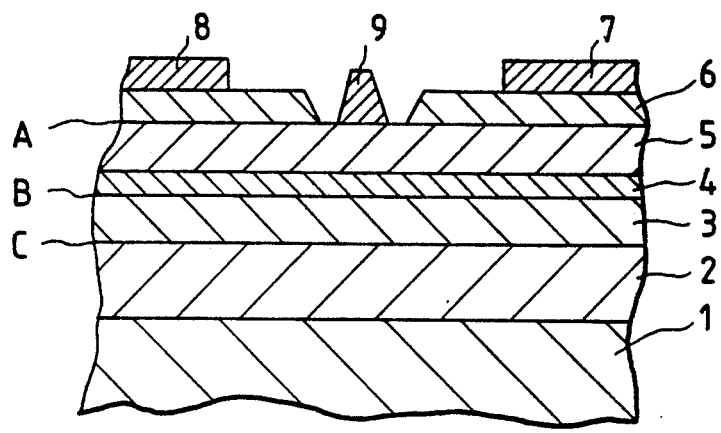
FIG. 1 is an explanatory diagram of the structure of a high electron mobility transistor of a pseudomorphic-type in accordance with an embodiment of the present invention.

Next, a detailed description will be given of the present invention. FIG. 1 is a structural diagram of a pseudomorphic-type FET which is an embodiment of the present invention.

In FIG. 1, reference numeral 1 denotes a GaAs substrate, and numeral 2 denotes an undoped GaAs buffer layer formed with a thickness of approximately 5000 Å, and this buffer layer is provided to smooth the irregularities in the GaAs substrate 1 prior to its growth. Numeral 3 denotes an undoped InGaAs layer formed with a thickness of approximately 100 Å such that the composition ratio of In becomes smaller toward the surface side (upper side in the drawing), and this layer forms a channel layer. Numeral 4 denotes an undoped $Al_{0.22}Ga_{0.78}As$ layer, which is formed with a thickness of approximately 20 Å and functions to ensure that the distribution of electrons do not extend into an n+. AlGaAs layer 5 and the mobility does not decline. Numeral 5 denotes an n+-type $Al_{0.22}Ga_{0.78}As$ layer, in which n-type impurities are doped with a concentration of approximately $2.5 \times 10^{18} cm^{-3}$, and which is formed with a thickness of approximately 300 Å and has the function of supplying electrons to the InGaAs layer 3 from the n-type impurities in the n+ AlGaAs layer through electron affinity between AlGaAs and InGaAs. Numeral 6 denotes an n+-type GaAs layer, which is formed with a thickness of approximately 700 Å and is formed to establish a good ohmic contact between a drain electrode 7 and a source electrode 8 on the one hand, and the n+-AlGaAs layer 5 on the other. A portion of the n+-type GaAs layer 6 between the drain electrode 7 and the source electrode 8 is removed, and a gate electrode 9 is formed on the exposed portion of the AlGaAs layer 5. The drain electrode 7 and the source electrode 8 are formed of an alloy of AuGe, Ni or the like, while the gate electrode 9 is formed of Ti/Al, Al, Ti/Pt/Au, WSi/Au, or the like.

Figure 2:
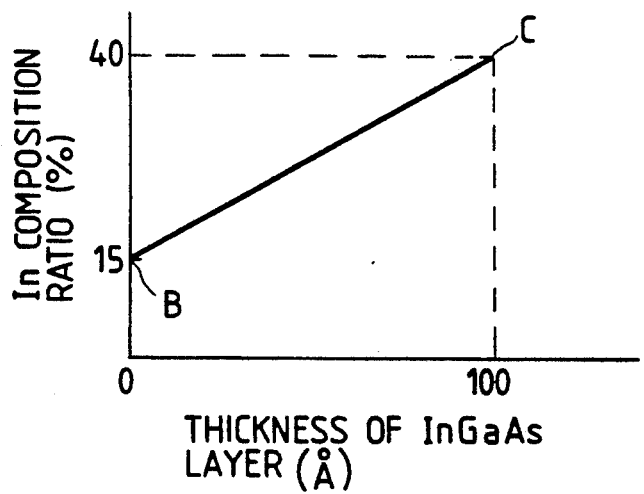
FIG. 2 is a diagram which shows changes in the In composition ratio of an InGaAs layer in an FET in accordance with the present invention.
Figure 3:
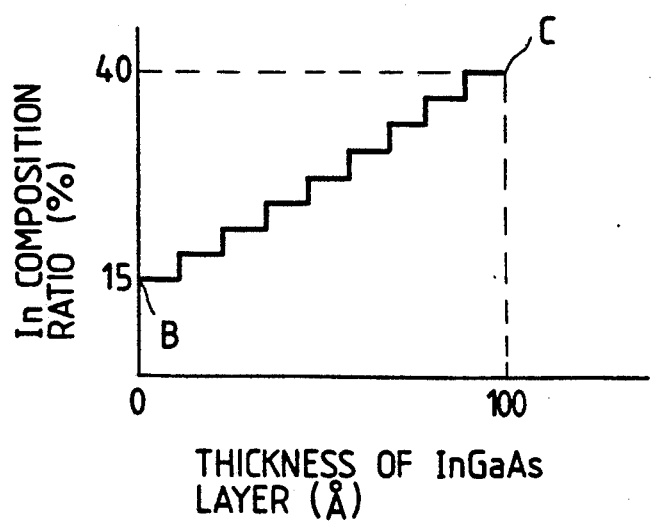
FIG. 3 is a diagram of another example which shows changes in the In composition ratio of the InGaAs layer in the FET in accordance with the present invention.

In the FET of this structure, as a bias voltage is applied to the gate electrode 9, and a voltage is applied across the drain electrode 7 and the source electrode 8, electrons move in the InGaAs layer 3, and current flows in correspondence with a voltage applied to the gate electrode. This InGaAs layer 3 has a different composition ratio of In in the thicknesswise direction thereof, and the composition ratio of In close to the AlGaAs layer 4 is small, while the In composition ratio on the GaAs substrate side is large. This relationship is shown in FIGS. 2 and 3. That is, in these drawings, the abscissa represents the thickness of the InGaAs layer 3, point B indicates an interface between the InGaAs layer 3 and the AlGaAs layer 4, while point C indicates an interface between the InGaAs layer 3 and the buffer layer 2.

The example shown in FIG. 2 is an example in which the composition ratio of In in InGaAs is continuously varied, while the example shown in FIG. 3 is an example in which the composition ratio of In is varied in steps. Either case shows an example in which the farther (deeper) from the substrate surface, the more the composition ratio of In is increased up to 40%.

If the above-described structure is adopted, if negative voltage is applied to the gate electrode as described above, the center of a distribution of electrons in the InGaAs layer 3 moves toward the rear surface side (toward the C side in FIGS. 2 and 3) of the substrate. As a result, on the basis of the aforementioned Formula (1), a becomes large, so that $g_m$ becomes small. According to the present invention, however, the composition ratio of In becomes large and the mobility $\mu$ of electrons becomes large, with the result that $g_m$ becomes large and an increased portion of a is consequently canceled by an increased portion of $\mu$, thereby inhibiting $g_m$ from becoming small.

Next, a description will be given of an example of the process of manufacturing the FET of this structure.

Figure 4:
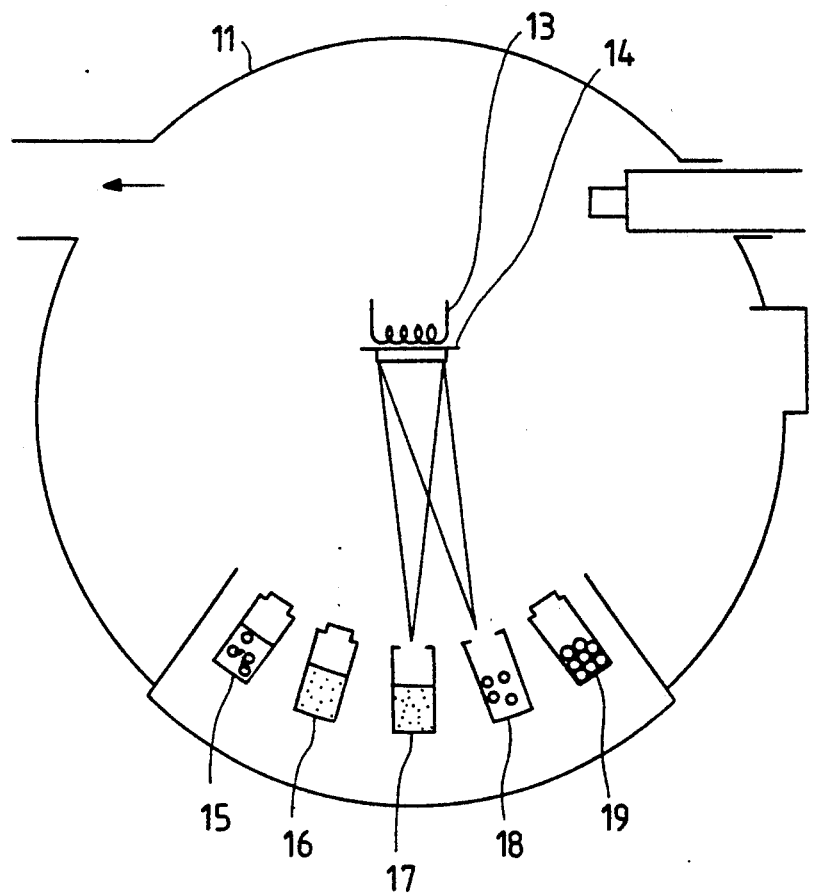
FIG. 4 is a conceptual diagram of a molecular beam epitaxy apparatus.
Figure 5:
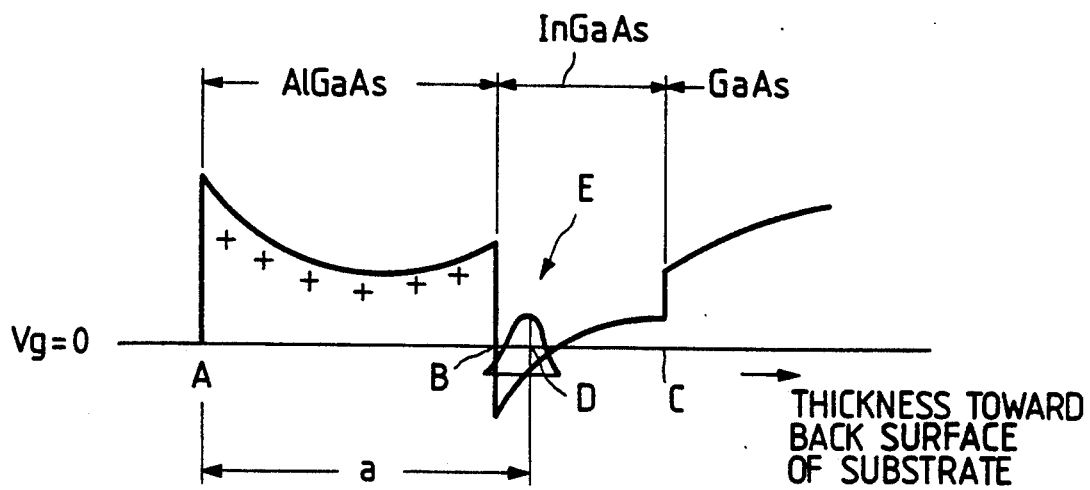
FIG. 5, is an energy band diagram below a gate electrode when the gate voltage in a conventional pseudomorphic-type FET is 0 V.
Figure 6:
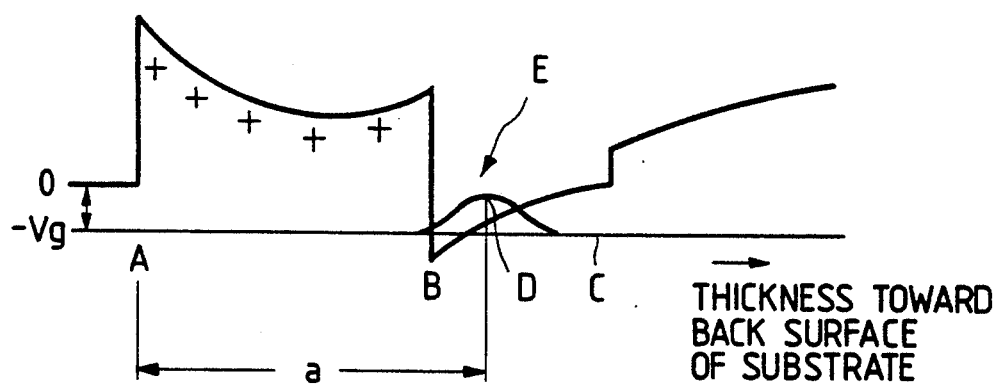
FIG. 6 is an energy band diagram below the gate electrode when the gate voltage in the conventional pseudomorphic-type FET is negative.

To manufacture the FET of this structure, when the temperature of a crucible, in which a compound element to be formed by a usual molecular beam epitaxy apparatus is contained, is increased, and a shutter is then opened, a compound semiconductor is deposited on the substrate. A conceptual diagram of this molecular beam epitaxy apparatus is shown in FIG. 4. In the drawing, reference numeral 11 denotes a furnace which is formed such that the interior thereof can be set to a vacuum of $10^{-10}$ to $10^{-11}$ Torr. Numeral 13 denotes a heater for increasing the temperature of the substrate, numeral 14 denotes a substrate mounting base, and numerals 15–19 denote crucibles in which respective elements are contained.

A description will be given of the method of forming the InGaAs layer by changing the composition ratio of In, which is an important point in the present invention. The GaAs substrate 1 is mounted on the substrate mounting base 14, the temperature of the substrate is set to approximately 540° C. by the heater 13, and the temperatures of the As crucible and the Ga crucible are fixed at approximately 290° C. and approximately 900° C., respectively, thereby forming the GaAs buffer layer 2. To change the composition ratio of In in a range of 15–40%, since the higher the temperature of the In crucible, the greater the amount of In, in order to increase the In composition ratio of the GaAs substrate-side InGaAs layer 3, if the temperature during the early period of formation of the InGaAs layer 3 is set to 840° C., and the temperature is then lowered gradually, and the temperature when the formation is completed is set to 810° C., the InGaAs layer 3 whose composition ratio of In is made continuously small is formed.

To form this InGaAs layer 3 in such a manner as that the composition ratio of In changes in steps as shown in FIG. 3, if the temperature is set in steps in the aforementioned temperature range, and if the process is repeated in which the shutter is opened by a predetermined several tens of angstroms, the temperature is lowered slightly and the shutter is opened by another several tens of angstroms, it is possible to form the INGaAs layer 3 whose In composition ratio is changed in steps.

In addition, to form the $Al_{0.22}Ga_{0.78}As$ layer 4 with an Al composition ratio of 22%, that layer can be obtained by setting the temperature of the Al crucible to approximately 1060° C. In addition, to form the n+-AlGaAs layer 5, the temperature of the Si crucible to approximately 1090° C., and to form the n+-type GaAs layer, the temperature of the crucible is set to approximately 1095° C., thereby allowing doping with impurities. It should be noted that the growth rate of the respective layers is substantially fixed and is 1.2 μm/time.

Although in the above-described embodiment a description has been given of the example of $Al_{0.22}Ga_{0.78}As$ having an Al composition ratio of 22%, the composition ratio is not restricted to the same, and it suffices if it is in the range of 15–40%.

As described above, to obtain the InGaAs layer 3 in which the In composition ratio is changed, the layer can be formed easily only by the temperature control of crucibles when the compound semiconductor is formed by epitaxy. In addition, since the In composition ratio of the InGaAs layer is changed on the gate electrode side and the substrate side, a change in the mutual conductance $g_m$ of the FET is small even with respect to a change in the voltage applied to the gate electrode. Hence, as for its noise figure, a fixed value can be obtained within a large range of the voltage applied to the gate electrode As a result, the device is capable of sufficiently coping with a high-frequency circuit.

What is claimed is:

1. A field-effect transistor comprising:
    a first semiconductor crystal layer of an indium-gallium-arsenide (InGaAs) containing indium (In), formed on a gallium-arsenide (GaAs) semiconductor substrate;
    a second semiconductor crystal layer of an aluminum-gallium-arsenide (AlGaAs), formed on said first semiconductor crystal layer; and
    a source electrode, a gate electrode, and a drain electrode which are formed on a surface of said second semiconductor crystal layer,
    wherein said first semiconductor crystal layer comprises a channel between the source electrode and the drain electrode and is formed such that an indium composition ratio of said first semiconductor crystal layer at a side of said second semiconductor crystal layer is smaller than that at a side of said gallium-arsenide (GaAs) semiconductor substrate to provide increasing electron mobility in the channel with increasing distance from the gate electrode.

2. A field-effect transistor as claimed in claim 1, wherein said indium composition ratio of said first semiconductor crystal layer is continuously increased in the direction toward said gallium-arsenide (GaAs) semiconductor substrate.

3. A field-effect transistor as claimed in claim 1, wherein said indium composition ratio of said first semiconductor crystal layer is increased in steps with closing to said gallium-arsenide (GaAs) semiconductor substrate.

4. A field-effect transistor as claimed in claim 1, wherein said indium composition ratio of said first semiconductor crystal layer is within a range from 15% to 40%.

* * * * *